United States Patent [19]
Watanabe et al.

[11] Patent Number: 5,845,497
[45] Date of Patent: Dec. 8, 1998

[54] THERMOELECTRIC REFRIGERATOR WITH CONTROL OF POWER BASED UPON SENSED TEMPERATURE

[75] Inventors: Hideo Watanabe, Kawasaki; Fumikazu Kiya, Noboribetsu; Katsuhiro Tsuno, Tokyo, all of Japan

[73] Assignee: Thermovonics Co., Ltd., Kanagawa, Japan

[21] Appl. No.: 997,817

[22] Filed: Dec. 24, 1997

[30] Foreign Application Priority Data

Dec. 27, 1996 [JP] Japan .................................. 8-350853

[51] Int. Cl.[6] ...................................... F25B 21/02
[52] U.S. Cl. ................................ 62/3.6; 62/3.7; 62/190
[58] Field of Search ............................... 62/3.2, 3.3, 3.6, 62/3.7, 131, 190, 228.1, 228.4

[56] References Cited

U.S. PATENT DOCUMENTS 5,548,969  8/1996  Lee .......................................... 62/228.4
5,689,957  11/1997  DeVilbiss et al. ........................... 62/3.7

*Primary Examiner*—John Sollecito
*Attorney, Agent, or Firm*—Evenson, McKeown, Edwards & Lenahan, P.L.L.C.

[57] ABSTRACT

An electric refrigerator is provided with a casing formed of a heat-insulating layer and defining an opening; a heat-insulating door for openably closing the opening of the casing; a thermal conductor arranged in the casing and provided with a heat-conducting surface located opposite an interior space in the casing; a Peltier device thermally connected with the thermal conductor; and a device power supply for feeding electric power to the Peltier device. The electric refrigerator is also provided with a control unit for controlling the device power supply so that, after the heat-insulating door is closed subsequent to opening thereof, the device power supply supplies the Peltier device with electric power controlled in a range of from 1.3 to 2 times as much rated electric power required to maintain a preset interior temperature of the casing.

2 Claims, 12 Drawing Sheets

THERMOELECTRIC REFRIGERATOR WITH CONTROL OF POWER BASED UPON SENSED TEMPERATURE

BACKGROUND OF THE INVENTION a) Field of the Invention

This invention relates to a temperature-controlled cabinet such as an electric refrigerator for general domestic or business use, and specifically to a storage cabinet for foods requiring temperature control, said storage cabinet making use of a Peltier device.

b) Description of the Related Art

A conventional electric refrigerator employs a flon-type refrigerant, and by making use of the latent heat of vaporization of the refrigerant, the interior is maintained at a low temperature. Ozone layer depletion by flon has however become an issue, resulting in active research and developments on refrigerators, freezers, refrigerated storage cabinets and the like, which make use of one or more Peltier devices, as candidate substitute cooling systems for those of the flon refrigerant system.

A cooling system of the above-mentioned type, which makes use of one or more Peltier devices, has excellent advantages in that it causes no ozone layer depletion owing to the non-use of flon gas, is excellent in cooling performance, is free of any potential risk of gas leakage, is free of vibrations or noise owing to the omission of a compressor, and has long service life and permits a dimensional reduction because the Peltier devices are primarily made of semi-conductors.

FIG. 13 is a diagram showing characteristic patterns of temperature control of a compressor-type refrigerator (preset interior temperature: +2.5° C., curve X) and temperature control of a refrigerator making use of a Peltier device (preset interior temperature: −0.2° C., curve Y).

As is clearly envisaged from this diagram, the compressor-type refrigerator requires a substantial time until the preset temperature is reached subsequent to a start of temperature control. In contrast, the refrigerator making use of the Peltier device reaches the preset temperature in a short time subsequent to a start of temperature control, and after that, the interior temperature is kept substantially constant. Compared with the compressor-type refrigerator, the refrigerator making use of the Peltier device therefore has advantages in that the accuracy of temperature control is extremely good and a preset interior temperature can be accurately retained.

Upon designing a conventional refrigerator making use of one or more Peltier devices, heat pumping capacity required as a refrigerator is calculated based on a surrounding temperature, a preset interior temperature, interior dimensions, the thermal conductivity of a heat-insulating material, the thickness of the heat-insulating material, the heat-pumping capacity of each Peltier device, and the temperature difference determined from the preset interior temperature and the surrounding temperature. In the light of the heat pumping capacity so calculated, the number of Peltier devices to be arranged is determined (see "Comprehensive Bibliograph of Technologies on Thermoelectric Conversion Systems, Chapter 4, Refrigerated Storage and Warm Storage", 87–88, Realize Inc.

Procedures such as those mentioned above have been followed upon designing a conventional refrigerator making use of one or more Peltier devices. No consideration has however been made as to how soon an interior temperature rise, which takes place when a heat-insulating door of the refrigerator is opened, should be economically lowered while supplying electric power at a low level.

This has led to various problems in that until the interior is cooled to a preset interior temperature subsequent to closure of a heat-insulating door, a substantial time is required, leading to a reduction in the quality of foods and the like stored in the refrigerator or in that electric power is supplied at an unnecessarily large level, resulting in higher running cost and uneconomical operation.

SUMMARY OF THE INVENTION

An object of the present invention is to overcome the above-described drawbacks of the conventional art and to provide an electric refrigerator capable of economically cooling the interior to a preset temperature in a short time even when a heat-insulating door is opened.

To achieve the above-described object, the presnt invention provides An electric refrigerator comprising:

a casing formed of a heat-insulating layer and defining an opening;

a heat-insulating door for openably closing the opening of the casing;

a thermal conductor arranged in the casing and provided with a heat-conducting surface located opposite an interior space in the casing;

a Peltier device thermally connected with the thermal conductor;

a device power supply for feeding electric power to the Peltier device; and a control unit for controlling the device power supply so that, after the heat-insulating door is closed subsequent to opening thereof, the device power supply supplies the Peltier device with electric power controlled in a range of from 1.3 to 2 times as much rated electric power required to maintain a preset interior temperature of the casing.

According to the present invention, the device power supply is controlled so that, after the heat-insulating door is closed subsequent to opening thereof, the device power supply supplies the Peltier device with electric power controlled in the range of from 1.3 to 2 times as much the rated electric power required to maintain the preset interior temperature of the casing as mentioned above. This makes it possible to economically cool the interior to the preset temperature in a short time even when the heat-insulating door is opened.

DETAILED DESCRIPTION OF THE INVENTION AND PREFERRED EMBODIMENTS

Figure 3:
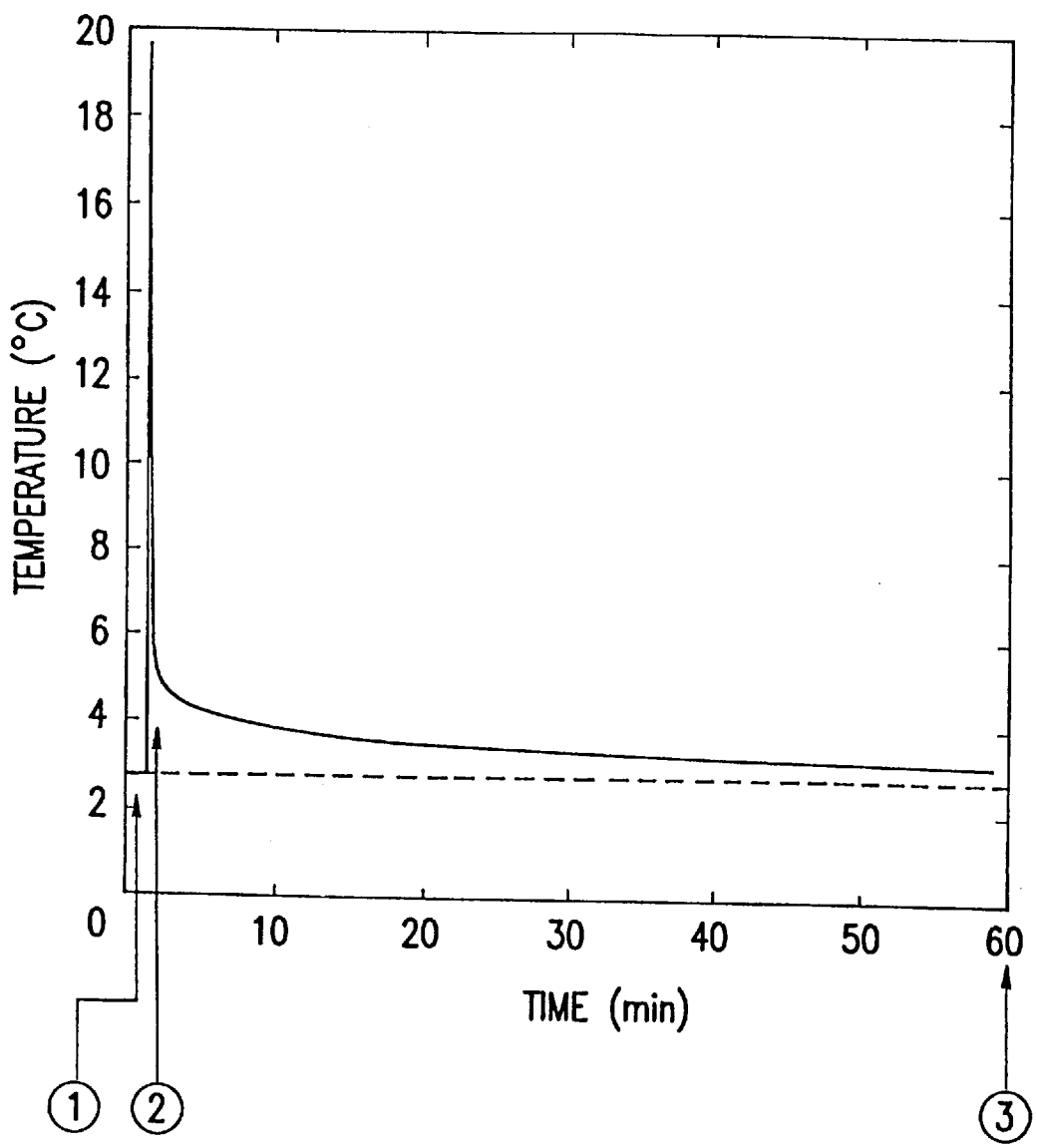
FIG. 3 is a temperature characteristic diagram showing a preset interior temperature for the refrigerator and variations in interior temperature when the door is closed subsequent to its opening.

The temperature characteristic diagram of FIG. 3 shows the preset interior temperature for the refrigerator, which had a capacity of 75 liters and was equipped with a Peltier device, and the variations in interior temperature when the door was closed subsequent to its opening. The preset interior temperature was 3.0° C. and the input electric power at that time was 48 W. Incidentally, the term "rated electric power" as used herein means an electric power input to a Peltier device, which is required to maintain the interior temperature at a preset interior temperature at an external air temperature of 30° C. without opening of a heat-insulating door. In this case, the input electric power of 48 W was equivalent to rated electric power.

As is evident from the diagram, the interior temperature before the heat-insulating door was opened (at a time point ①) was maintained accurately at the preset interior temperature of 3° C. since the rated electric power of 48 W was inputted. By opening the door (at a time point ②), the interior temperature suddenly arose. When the heat-insulating door was closed 10 seconds later, the interior temperature began to drop. Because the input electric power was 48 W, the gradient of a temperature drop however became extremely gentle after an elapsed time of about 5 minutes and the interior temperature did not reach the preset interior temperature of 3.0° C. even an elapsed time of 60 minutes (at a time point ③).

When a refrigerator is driven as described above without changing rated electric power, it is impossible to sufficiently cope with a sudden rise in its interior temperature subsequent to opening of its heat-insulating door even when a Peltier device is used. A long time is therefore required to cool the interior to the preset temperature. There is hence a potential problem that foods and the like stored in the refrigerator may be deleteriously affected during this long time.

Figure 1:
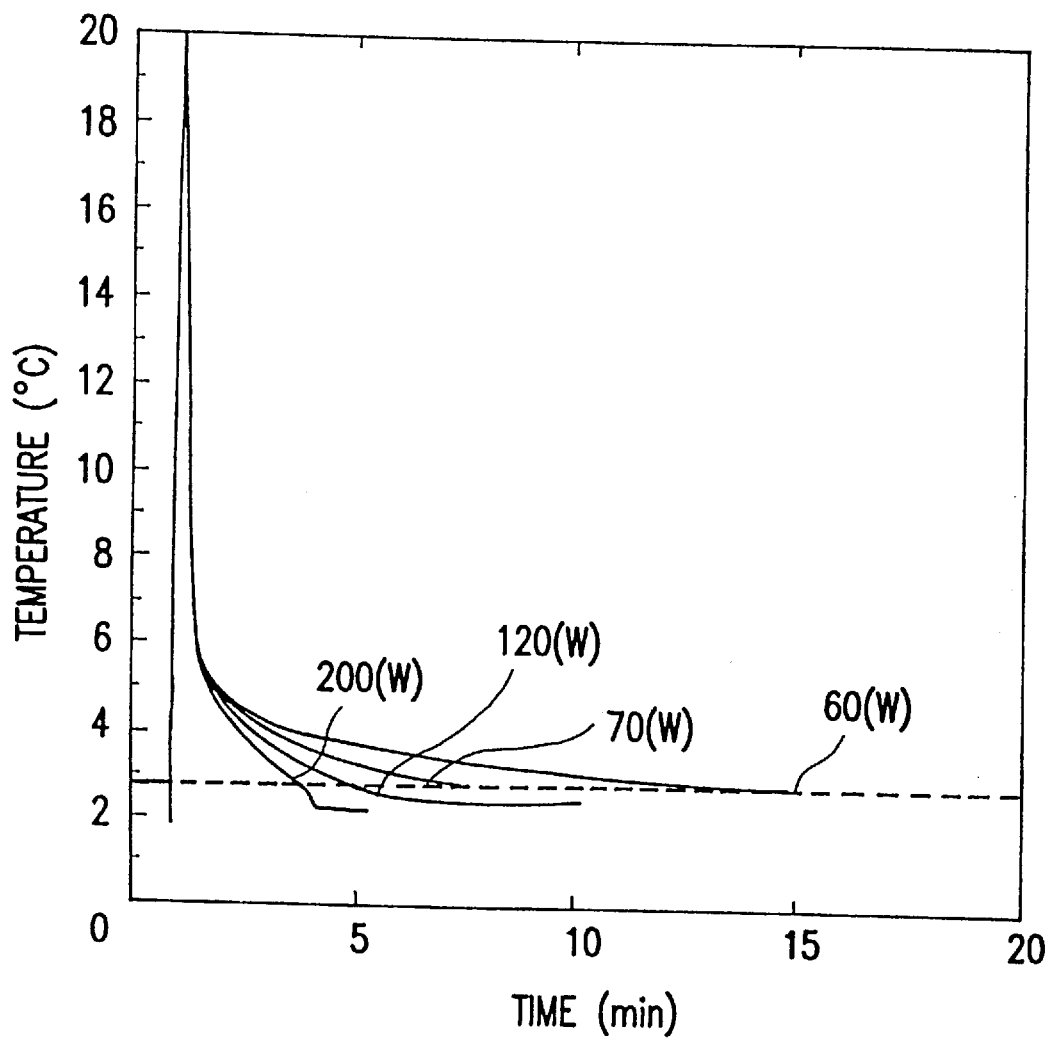
FIG. 1 is a temperature characteristic diagram showing a preset interior temperature for a refrigerator and variations in interior temperature when a door is closed subsequent to its opening.

The characteristic diagram of FIG. 1 illustrates temperature variations when the heat-insulating door was closed subsequent to its opening under the same conditions as described above except that the input electric power was changed to 60 W, 70 W, 120 W and 200 W. Since rated electric power was 48 W as described above, the input electric power of 60 W is 1.25 times as much as the rated electric power, the input electric power of 70 W is about 1.5 times as much as the rated electric power, the input electric power of 120 W is 2.5 times as much as the rated electric power, and the input electric power of 200 W is about 4.2 times as much as the rated electric power.

As is apparent from this diagram, when the input electric power was 60 W, the interior temperature did not drop to the preset interior temperature until 15 minutes or longer had elapsed subsequent to the closing of the heat-insulating door. It is therefore impossible to meet the requirement of the Japanese industrial standard (JIS C9607) specified from the viewpoint of quality maintenance of foods (the interior of a refrigerator shall be cooled to a preset interior temperature in 12 minutes subsequent to closing of a heat-insulating door). On the other hand, the increase of the input electric power to 70 W made it possible to cool the interior of the refrigerator to the preset interior temperature in 12 minutes. It was possible to reach the preset interior temperature earlier by further increasing the input electric power to 120 W or 200 W.

Figure 2:
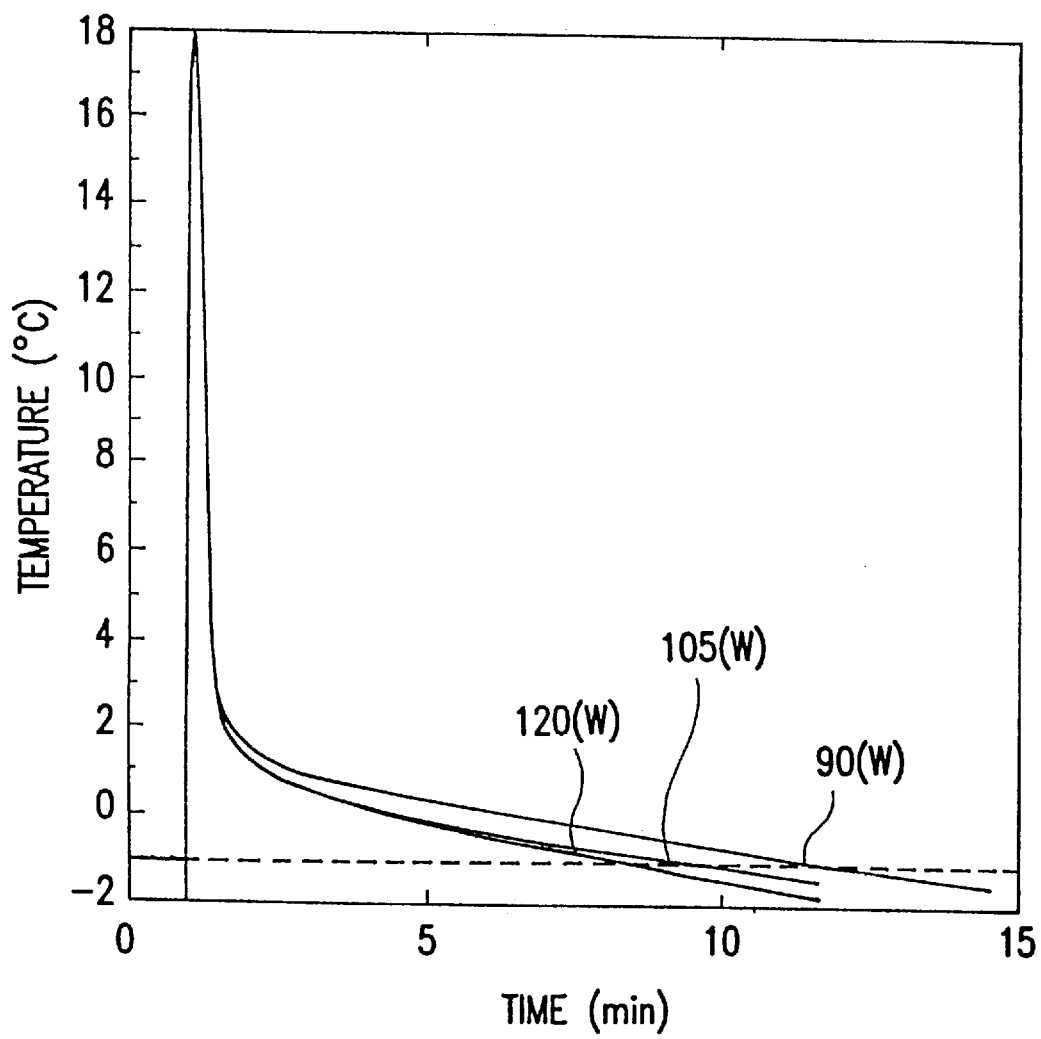
FIG. 2 is a temperature characteristic diagram showing a preset interior temperature for the refrigerator and variations in interior temperature when the door is closed subsequent to its opening.

The characteristic diagram of FIG. 2 illustrates temperature variations when the heat-insulating door was closed subsequent to its opening under the same conditions as described above except that the preset interior temperature was −1° C. (chilled temperature zone), the rated electric power was change to 70 W, and the input electric power was changed to 90 W, 105 W and 120 W. Since the rated electric power was 70 W in this case, the input electric power of 90 W is 1.3 times as much as the rated electric power, the input electric power of 105 W is about 1.5 times as much as the rated electric power, and the input electric power of 120 W is about 1.7 times as much as the rated electric power.

As is evident from FIG. 1 and FIG. 2, an increase of input electric power to a level at least 1.3 times as much as rated electric power makes it possible to cool an interior to a preset interior temperature in 12 minutes after closure of the heat-insulating door, that is, in such a short time that no substantial deleterious effect is given to the quality of foods or the like.

Figure 4:
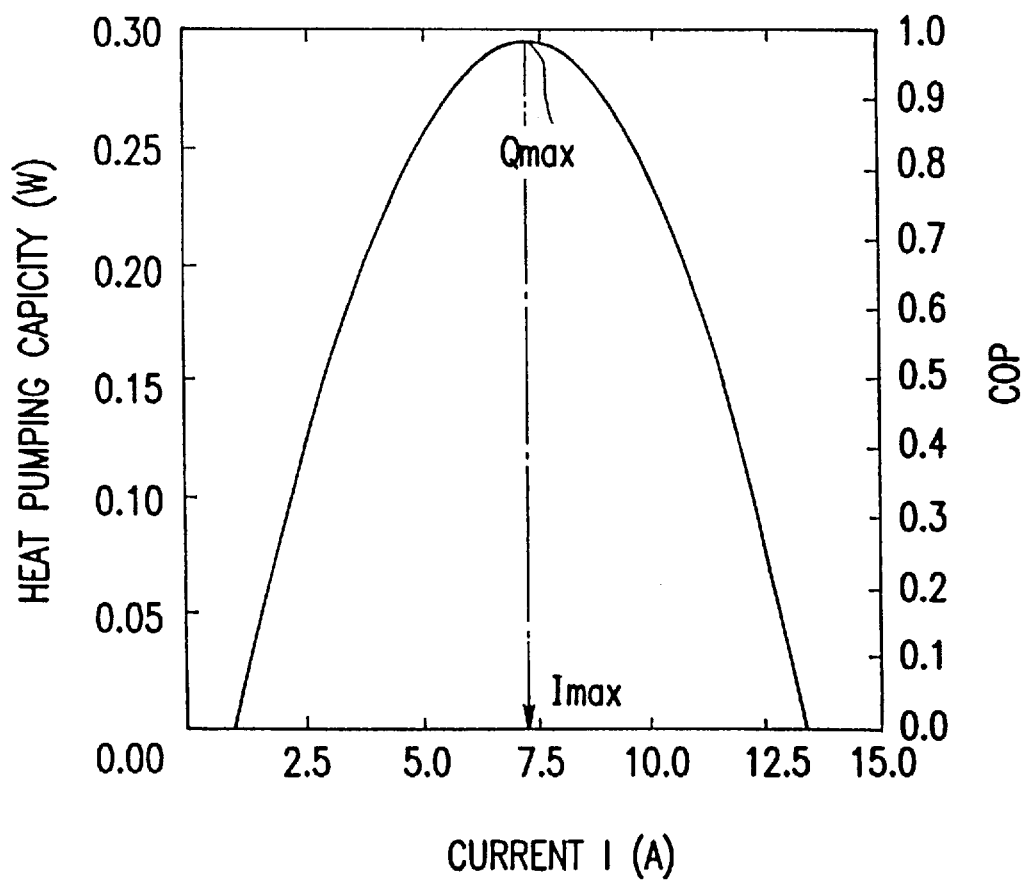
FIG. 4 is a characteristic diagram illustrating a relationship between a current supplied to a Peltier device and its heat pumping capacity.

The diagram of FIG. 4 illustrates relationships between a current supplied to a Peltier device and the heat pumping capacity of the Peltier device and COP. As is apparent from this diagram, the heat pumping capacity of the Peltier device increases with the current when the temperature different is constant. As further characteristics, the heat pumping capacity then reaches a maximum ($Q_{max}$) at a certain current value so that the COP also becomes maximum, and a further increase in the current conversely leads to a decrease in the heat pumping capacity (COP). In the specification of the present invention, a current value which is fed to a Peltier device when the above-described maximum pumping capacity $Q_{max}$ is obtained is defined as a maximum current value $I_{max}$.

Figure 5:
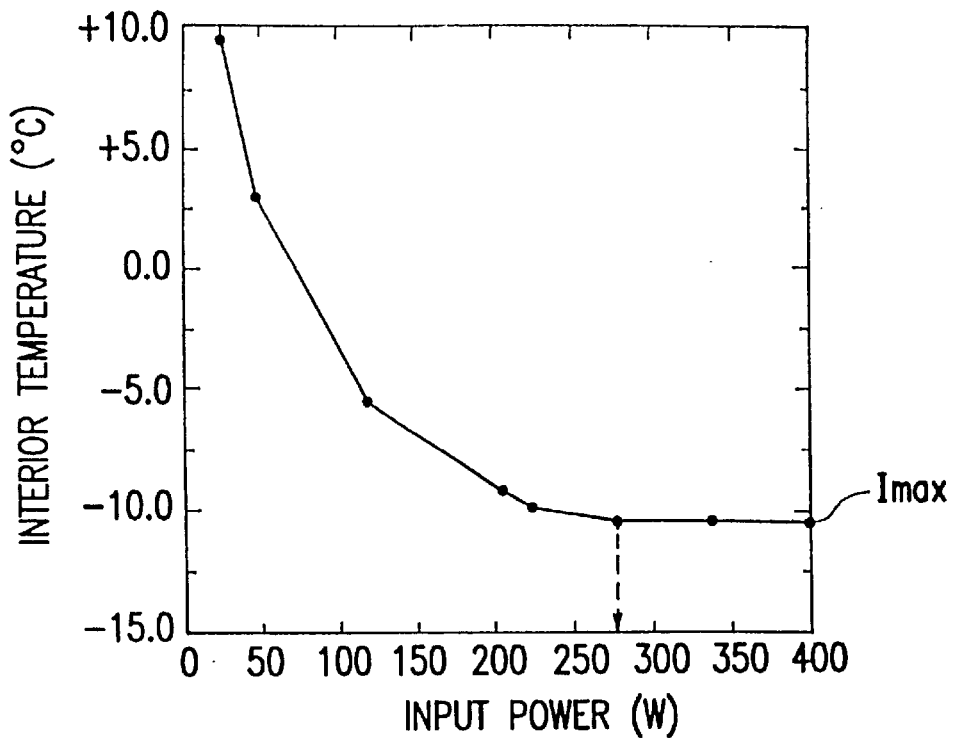
FIG. 5 is a characteristic diagram showing a relationship between input electric power to a Peltier device and an interior temperature.

The characteristic diagram of FIG. 5 illustrates a relationship between input electric power to a Peltier device and a lowest reachable temperature in an interior. In this diagram, the $I_{max}$ of the Peltier device was 400 W. The lowest reachable temperature in the interior was leveled off as low as around 270 W. Namely, it is understood that the lowest reachable interior temperature was substantially reached with input electric power far smaller than the operation condition of $I_{max}$ (i.e., 400 W in this experiment) and that an input of greater electric power is wasting. According to another experiment, it was confirmed that, when the preset interior temperature and the rated electric power were set at −7° C. and 130 W, respectively, an input of 240 W electric power was sufficient to cool the interior to the preset interior temperature in 12 minutes after the heat-insulating door was closed subsequent to its opening. The ratio of input electric power/rated electric power in this case was 240/130=1.8.

Figure 6:
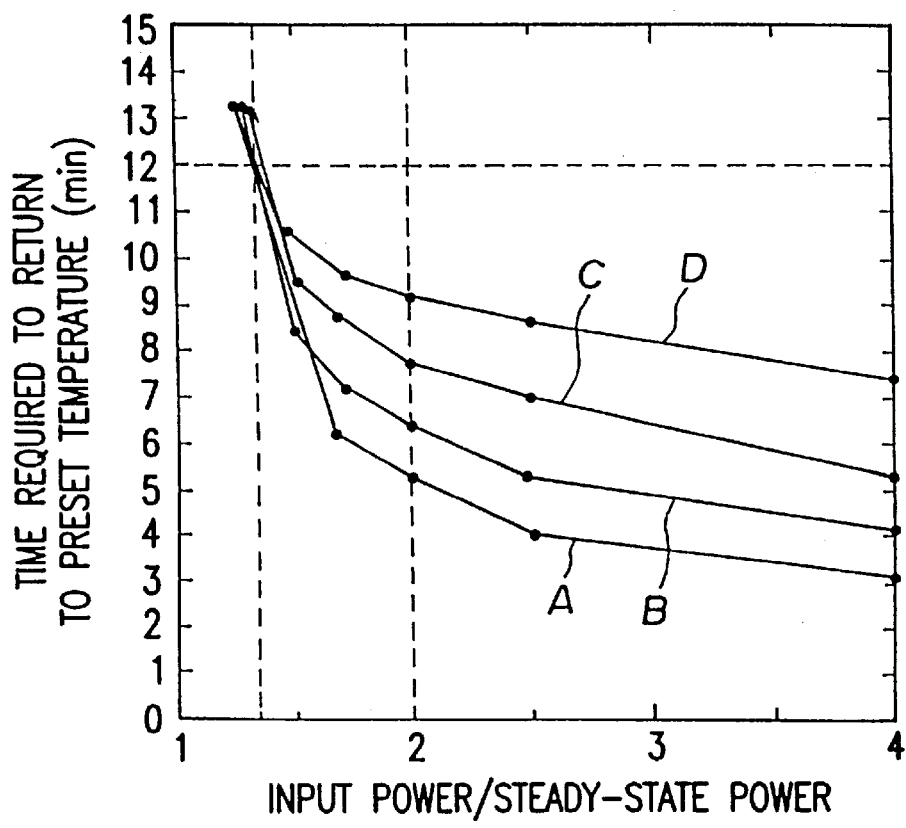
FIG. 6 is a characteristic diagram depicting an input electric power/steady-state electric power ratio and a time required to return to a preset temperature.
Figure 7:
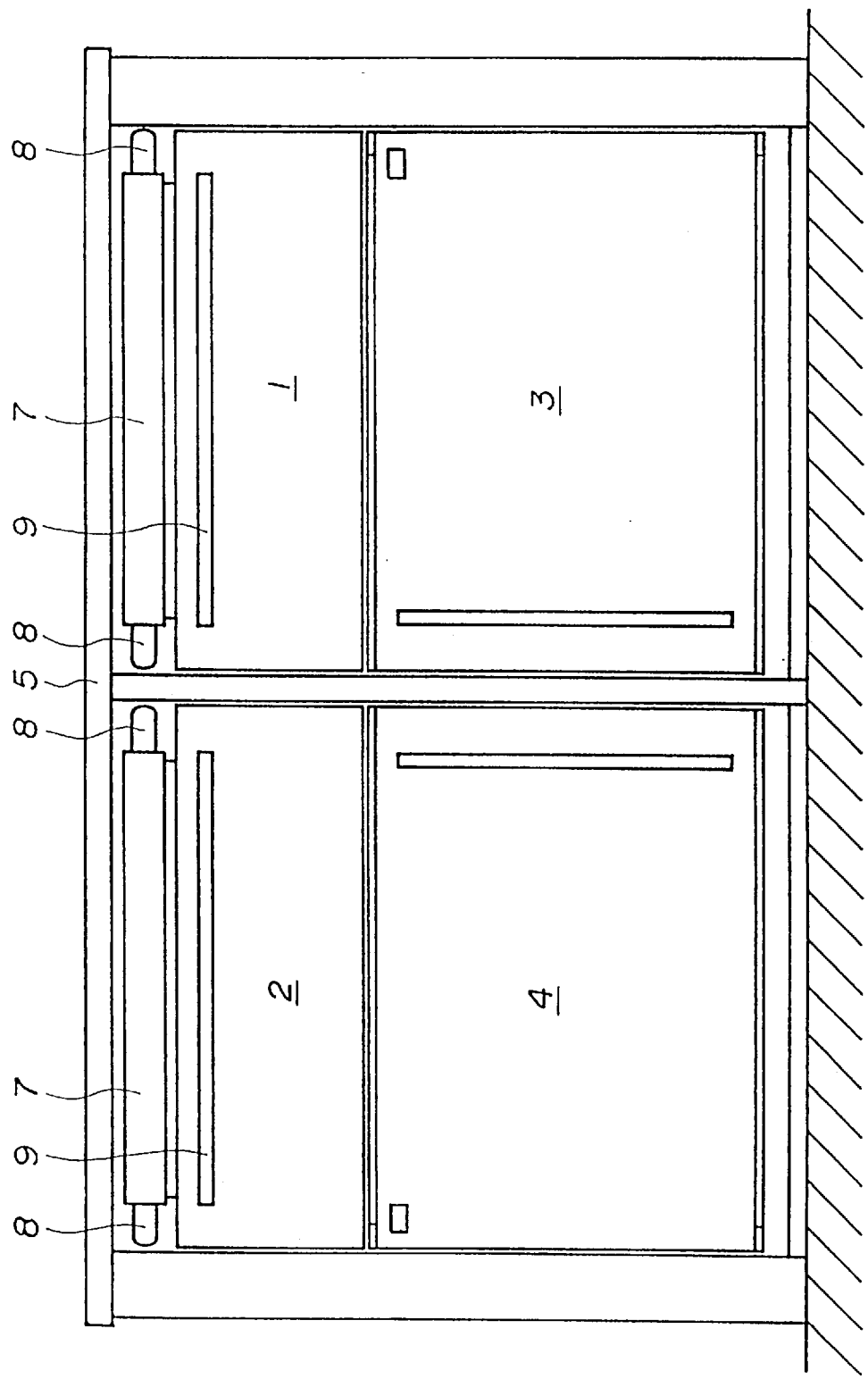
FIG. 7 is a front view of a temperature-controlled appliance according to an embodiment of the present invention.

The characteristic diagram of FIG. 6 depicts a relationship between a ratio of input electric power/rated electric power and a time required to return to a preset interior temperature after closing of the heat-insulating door subsequent to its opening when the preset interior temperature and the rated electric power were both varied. In the diagram, a curve A indicates an experiment in which the preset interior temperature was +3° C. and the rated electric power was 48 W, a curve B represents another experiment in which the preset interior temperature was −1° C. and the rated electric power was 70 W, a curve C denotes a further experiment in which the preset interior temperature was −4.7° C. and the rated electric power was 100 W, and a curve D designates a still further experiment in which the preset interior temperature was −7° C. and the rated electric power was 130 W.

As is readily envisaged from the diagram, the ratio of input electric power/rated electric power has to be increased to at least 1.3 times under the respective conditions in order to cool the interior to the preset interior temperature in 12 minutes after the heat-insulating door is closed subsequent to its opening. However, the time required to return to the preset temperature is not shortened substantially even when the input electric power is increased significantly. Further, the quality of foods is not substantially affected provided that the time required to return to the preset temperature is not longer than 12 minutes. Conversely, an increase in the input electric power results in higher running cost and uneconomical operation. It is therefore necessary to control the ratio of input electric power/rated electric power below 2. In view of these, the ratio of input electric power/rated electric power is limited to the range of from 1.3 to 2 in the present invention.

Referring next to FIGS. 7 through 12, a description will be made about the specific construction of the combined temperature-controlled appliance according to the embodiment of the present invention.

The temperature-controlled appliance according to this embodiment is divided into a quick freezing compartment 1, a defrosting compartment 2, a refrigerated storage compartment 3 and a partial freezing compartment 4. The compartments 1–4 are independently and individually controlled in temperature. The compartments 1–4 are stacked in two stages and are integrally built in a cooking table 5, so that they are of the fixed type.

The quick freezing compartment 1 and the defrosting compartment 2 can be pulled out of the table 5 to facilitate cooking, whereas the refrigerated storage compartment 3 and the partial freezing compartment 4 are built in the table 5.

Figure 9:
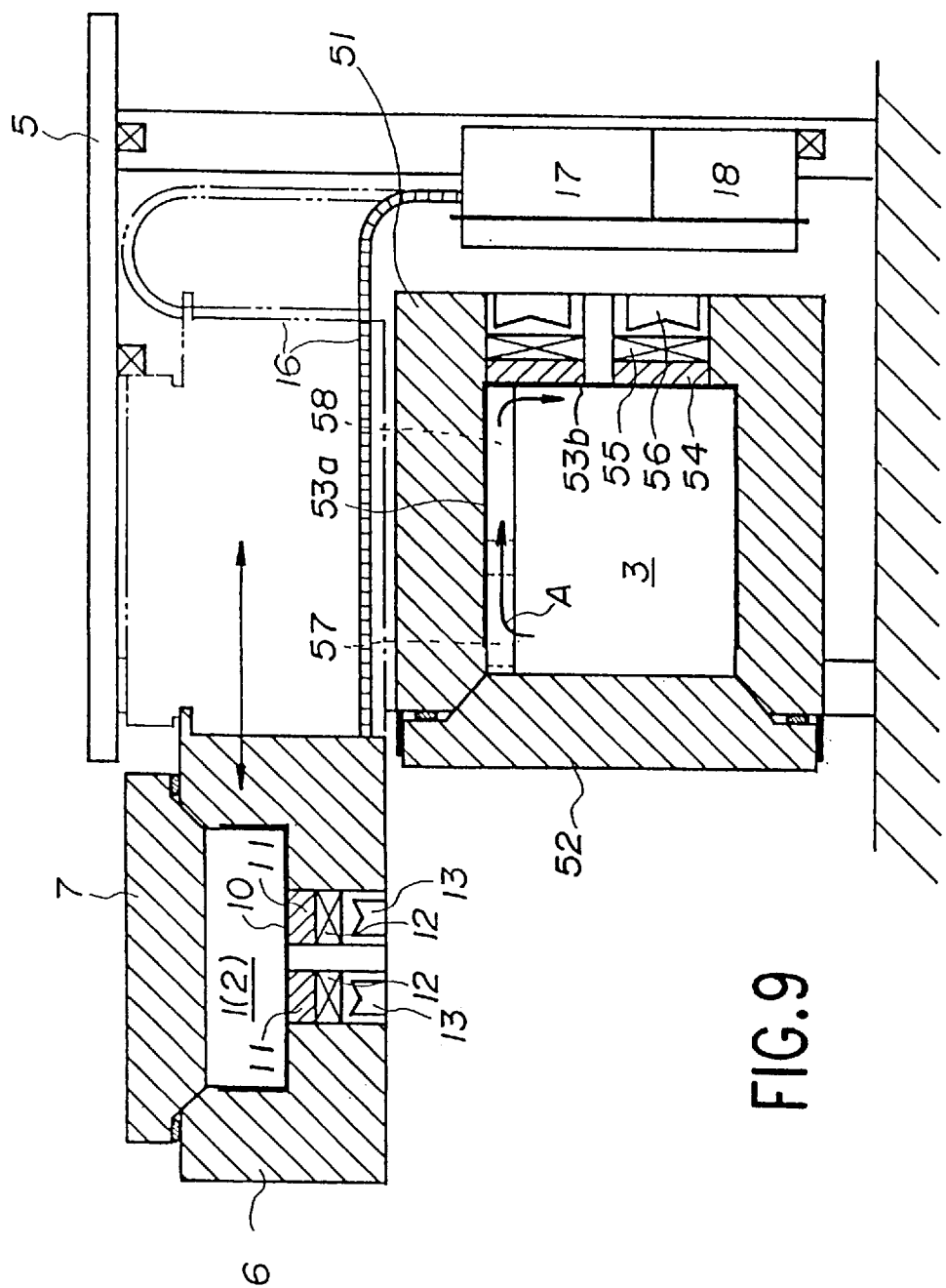
FIG. 9 is a cross-sectional side view of the temperature-controlled appliance.
Figure 10:
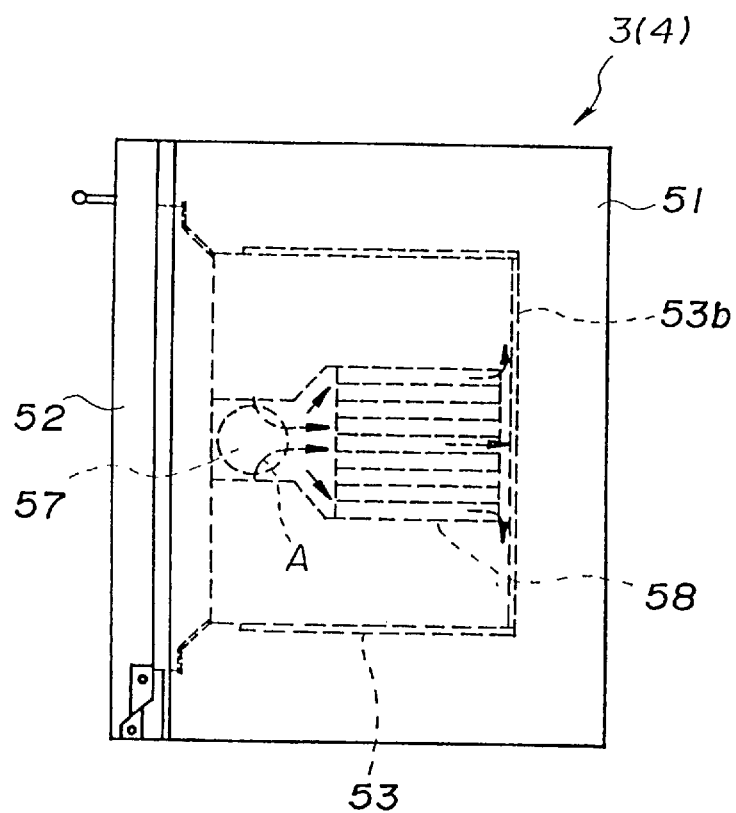
FIG. 10 is a plan view of a refrigerated storage compartment and a partial freezing compartment, both of which constitute the temperature-controlled appliance.
Figure 11:
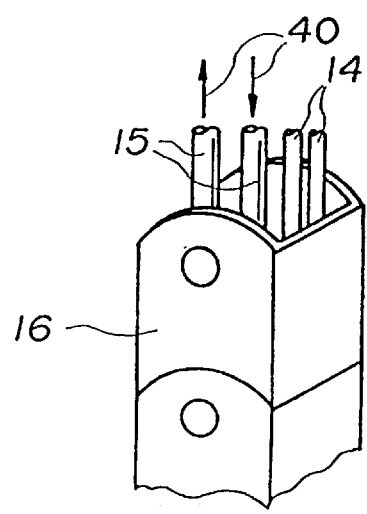
FIG. 11 is a partly-enlarged, perspective view of a cord/hose case used in the temperature-controlled appliance.

As is illustrated in FIG. 9, the quick freezing compartment 1 (the defrosting compartment 2) has a heat-insulating casing 6 in the form of a box opening upward and a heat-insulating cover 7 which openably closes up the opening. The heat-insulating cover 7 is provided at opposite ends thereof with handles 8, and a handle 9 is arranged on a front wall of the heat-insulating casing 6.

As is also shown in FIG. 9, a container-shaped first thermal conductor 10 made, for example, of aluminum or the like is arranged inside the heat-insulating casing 6. On a rear side of a bottom portion of the heat-insulating casing 6, a Peltier device 12 of the cascaded construction is arranged via a second thermal conductor 11 made, for example, of aluminum or the like in the form of plural blocks. Further, a circulation jacket 13 for a heat transfer medium is joined on an outer side of the second thermal conductor 11. Feed cords 14 connected to the Peltier device 12 and hoses 15 connected to the circulation jacket 13 are received in an elongated, flexible cord/hose case 16 (see FIG. 11) and are connected to a second heat-dissipating unit 17 (see FIGS. 8 and 9).

In a state where the freezing compartment 1 has been pulled out of the cooking table 5 as shown in FIG. 9, the cord/hose case 16 is in an extended form. When the freezing compartment 1 is pushed in, the cord/hose case 16 is accommodated in a bent form behind the freezing compartment 1 as indicated by two-dot chain lines. Incidentally, the feed cords 14 are connected to a power supply controller 18 which is arranged near the second heat-dissipating unit 17.

In this embodiment, the freezing compartment 1 and the defrosting compartment 2 are smaller in storage capacity than the refrigerated storage compartment 3 and the partial freezing compartment 4, the hoses 15 of both the compartments 1,2 are connected to only one heat-dissipating unit, that is, the second heat-dissipating unit 17. However, each compartment is provided with its own power supply controller 18. The feed cord 14 connected to the freezing compartment 1 is connected to the freezing power supply controller 18, while the feed cord 14 connected to the defrosting compartment 2 is connected to a defrosting power supply controller (not shown).

Figure 12:
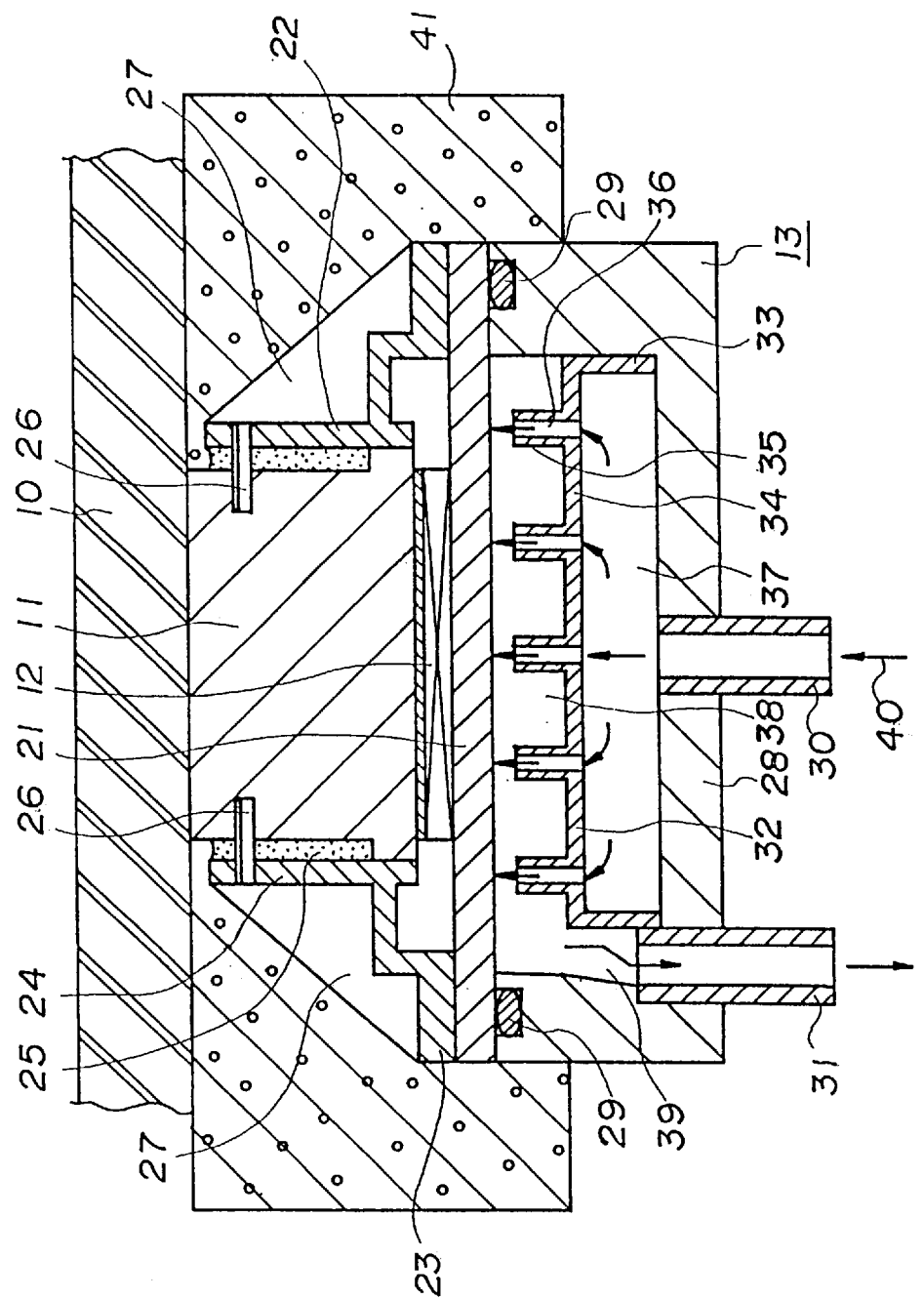
FIG. 12 is an enlarged cross-sectional view of a circulation jacket for a heat transfer medium, which is used in the temperature-controlled appliance.
Figure 13:
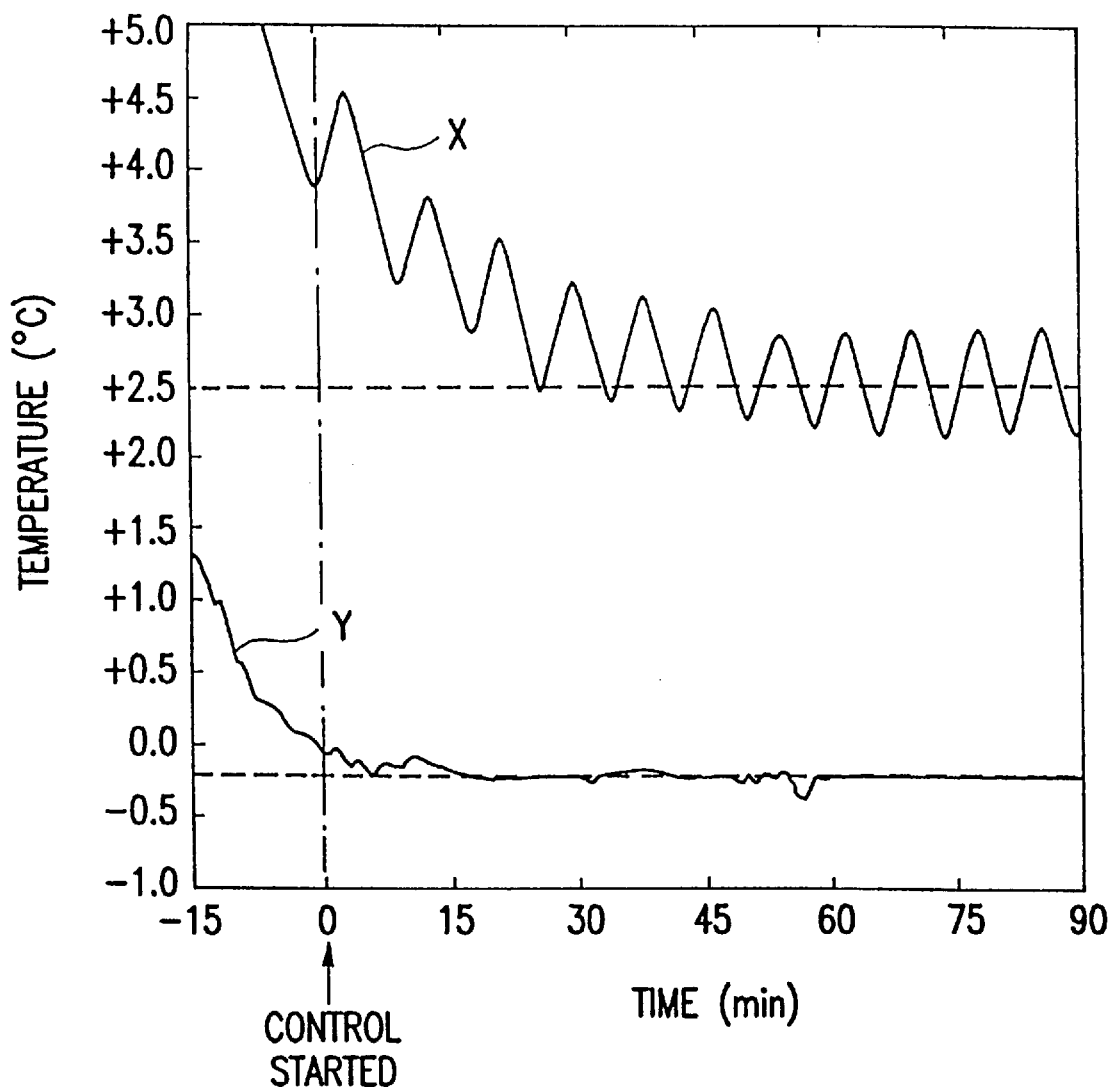
FIG. 13 is a diagram showing characteristic patterns of temperature control of a compressor-type refrigerator and temperature control of a refrigerator making use of a Peltier device.

FIG. 12 illustrates in detail the structure around the circulation jacket 13 for the heat transfer medium. This circulation jacket 13 has a plate-shaped heat-exchanging base 21 joined to a heat-dissipating side of the Peltier device 12. From a peripheral portion of the heat-exchanging base 21, a first frame 22 extends toward the second thermal conductor 11. The first frame 22 is a hollow shape which opens at upper and lower parts thereof, has a basal end portion 23 and an extended portion 22 extending upwards from the basal end portion 23, and has a substantially stepped cross-sectional shape. The basal end portion 23 is joined in a liquid-tight fashion to a peripheral part of an upper surface of the heat-exchanging base 21 by using, for example, an adhesive or an 0-ring and an adhesive in combination.

As is shown in the drawing, the extended portion 24 is located in parallel with and opposite a peripheral wall of the second thermal conductor 11 with an adhesive 25 poured therebetween so that the second conductor 11 and the first frame 22 are integrally joined together.

Plural positioning pins 26 extend across the peripheral wall of the second thermal conductor 11 and the extended portion 24 to prevent any relative positional displacement between the second thermal conductor 11 and the first frame 22 before the adhesive 25 hardens completely. The extended portion 24 is provided on an outer side thereof with plural (four in this embodiment) reinforcing ribs 27 which extend toward the basal end portion 23, whereby the first frame 22 is allowed to remain rigid.

Further, the stepwise, in other words, nonlinear configuration between the basal end portion 23 and the extended portion 24 surely provides the first frame 22 with a longer creeping distance from the second thermal conductor 11 of the first frame 22 to the heat-exchanging base 21, thereby reducing a quantity of heat to be returned through the first frame 22.

On a peripheral part of a lower side of the heat-exchanging base 21, a second frame 28 having a hollow shape which is substantially closed at a lower part thereof but is open at an upper part thereof is bonded in a liquid-tight fashion with an 0-ring 29 interposed therebetween. The second frame 28 is provided at an approximately central part thereof with a supply pipe 30 and near a peripheral edge thereof with a drain pipe 31.

A distributing member 32, which is arranged in the hollow space of the second frame 28, is provided with a peripheral wall 33, an upper wall 34 disposed in continuation to an upper edge of the peripheral wall 33, and a number of nozzle portions 35 extending from the upper wall 34 toward the heat-exchanging base 21. Through the nozzle portions 35, jet nozzles 36 are formed, respectively.

By fixing the distributing member 32 within the second frame 28, a flattened first space 37 is formed on a side of the supply pipe 30 relative to the distributing member 32 and a flattened second space 38 is formed on a side of the heat-exchanging base 21 relative to the distributing member 32. Further, a drain channel 39 is formed communicating the second space 38 with the drain pipe 31.

As is depicted in the drawing, when the heat transfer medium 40 formed of purified water, antifreeze or the like (purified water is used in this embodiment) is supplied through the central supply pipe 30, it immediately spreads out in the first space 37 and vigorously jets out from the individual nozzle portion 35 (jet nozzles 36) toward the lower side of the heat-exchanging base 21 in substantially a perpendicular direction. The heat transfer medium 40 hits the heat-exchanging base 21 and absorbs heat therefrom. It then promptly spreads out in the narrow second space 38 and flows out of the system through the drain channel 39 and the drain pipe 31. The thus-drained heat transfer medium 40 flows though the hoses 15 shown in FIG. 11. It is then subjected to forced cooling in a radiator (not shown) arranged in the second heat-dissipating unit 17 illustrated in FIG. 9 and is then supplied again to the circulation jacket 13 by an unillustrated pump. In FIG. 12, numeral 41 indicates a heat-insulating material layer filled around the circulation jacket 13 for the heat transfer medium.

The refrigerated storage compartment 3 (the partial freezing compartment 4) has a heat-insulating casing 51 in the form of a box which is open through a front wall. A heat-insulating door 52 is arranged to openably close the opening in the front wall. In close contact with an inner wall of the heat-insulating casing 51, a container-shaped first thermal conductor 48 is arranged. A block-shaped second thermal conductor 54 is disposed on a rear side of a substantially central part of a wall portion of the first thermal conductor 53, said wall portion being located opposite the opening, in other words, an end wall portion of the first thermal conductor 53. On a rear side of the second thermal conductor 54, a circulation jacket 56 for the heat transfer medium is arranged via a Peltier device 55 of the cascaded construction. The construction and function of the circulation jacket 56 for the heat transfer medium are similar to those described above with reference to FIG. 12, and their description is therefore omitted herein.

To cause interior air A (see FIG. 9 and FIG. 10), which exists inside the refrigerated storage compartment 3, to flow along an upper peripheral wall 53a of the first thermal conductor 53, to hit an end wall 53b in which the Peltier device 55 is arranged and then to flow down along the end wall 53b as indicated by arrows, the upper peripheral wall 53a is provided on an inner side thereof with an interior fan 57 and a number of heat-absorbing fins 58 having guide grooves extending in parallel with each other. In addition, the upper peripheral wall 53a and the end wall 53b are slightly thicker than the remaining walls of the first thermal conductor 53.

Owing to such functions of the interior fan 57 and the heat-absorbing fins 58 provided with the guide grooves, a high cooling efficiency is obtained when the interior air A is caused to flow from the upper peripheral wall 53a and long a surface of the end wall 53b.

Figure 8:
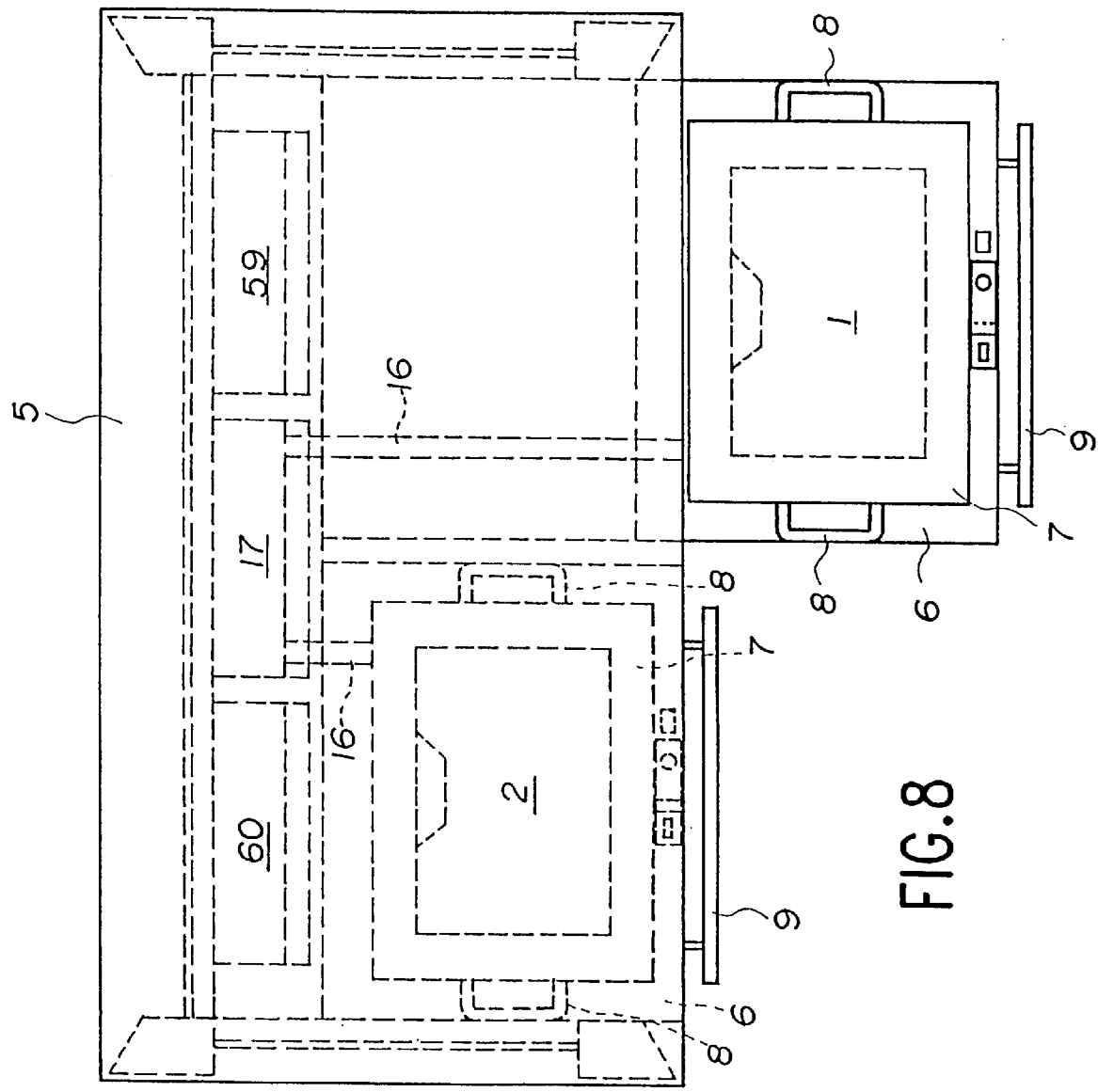
FIG. 8 is a plan view of the temperature-controlled appliance.

In this embodiment, the quick freezing compartment 1 and the defrosting compartments 2 are used to freeze and defrost only necessary items, and the capacities of both the compartments 1,2 are relatively small, for example, about 7 liters each. In contrast, the refrigerated storage compartment 3 and the partial freezing compartment 4 are used for storage so that the capacities of both the compartments 3,4 are relatively large, for example, about 30 liters each. Since the capacities of both the compartments 3,4 are large and strict control of their interior temperatures is needed to maintain constant the quality of the stored foods and the like, the refrigerated storage compartment 3 and the partial freezing compartments 4 are provided with their own heat-dissipating units, namely, the first heat-dissipating unit 59 and the third heat-dissipating unit 60, respectively, as shown in FIG. 8 to reduce external disturbances as much as possible.

Figure 14:
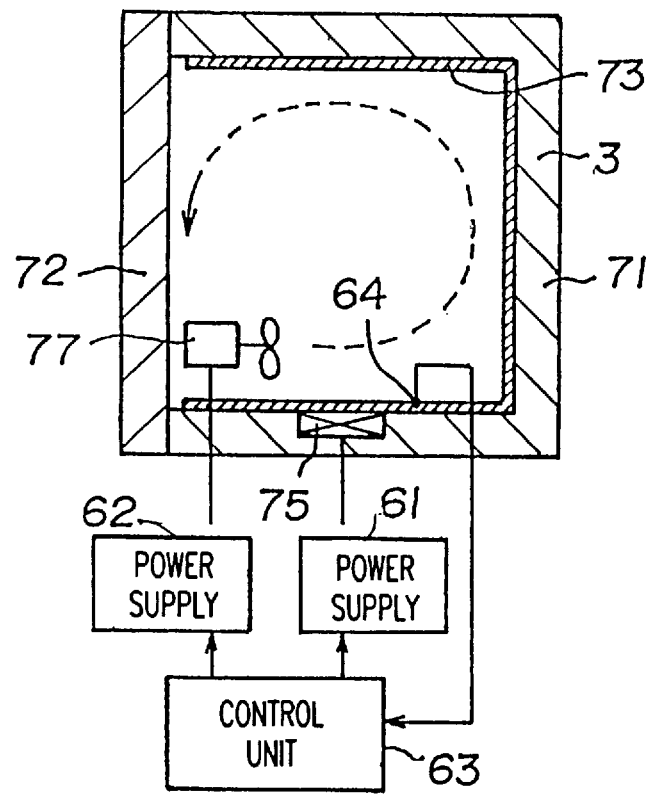
FIG. 14 is a simplified block diagram illustrating one example of an electric power supply control system suitable for use in the temperature control of each compartment of the temperature-controlled appliance.

With reference to FIG. 14, a description will hereinafter be made of the one example of the electric power supply control system suitable for use in the temperature control of each of the compartments 1–4 of the above-described temperature-controlled appliance. The drawing shows a refrigerated storage compartment 3 as an example, and this refrigerated storage compartment 3 has a heat-insulating casing 71 in the form of a box opening leftward and a heat-insulating door 72 which openably closes up the opening. On an inner wall of the heat-insulating casing 71, a box-shaped thermal conductor 73 made, for example, of aluminum is arranged. A Peltier device 75 is driven by electric power supplied from a device power supply 61, while an interior fan 77 is driven by electric power supplied from a fan power supply 62. These device power supply 61 and fan power supply 62 are controlled by signals from a control unit 63. Further, the thermal conductor 73 is provided on a surface thereof with a temperature sensor 64 in the vicinity of a position where the Peltier device 75 is arranged. Detection signals from the temperature sensor are inputted in the control unit 63.

When the heat-insulating door 72 of the refrigerated storage compartment 3 is opened or an item to be refrigerated, such as a food, is placed in the refrigerated storage compartment, the interior temperature rises rapidly. This temperature rise is detected by the temperature sensor 64, and based on a detection signal from the temperature sensor, the control unit 63 supplies a large quantity of electric power to the Peltier device 75 by way of the device power supply 61.

As a consequence, the temperature of the thermal conductor 73 rapidly drops especially in the vicinity of the position where the Peltier device 75 is arranged. The temperature of the thermal conductor hence begins to drop toward a temperature at which water freezes or lower. Accordingly, while monitoring detection signals from the temperature sensor 64, the electric power to the interior fan 77 is increased at a time point shortly before the temperature of the thermal conductor drops to a water-freezing temperature. As a result, the linear velocity of the interior air increases, leading to a higher thermal conductance at the thermal conductor 73. Freezing of water on the surface of the thermal conductor 73 is therefore avoided, thereby making it possible to maintain the interior humidity high.

Incidentally, the high-speed rotation of the interior fan 77 can be either continuous or intermittent. However, rotation of the interior fan at a high speed for an unduly long time results in wasting of electric power and also in deleterious effects on the storage of vegetables or the like. It is therefore necessary to set such a control mode that the time of high-speed rotation is limited to such an extent as permitting maintenance of the temperature and humidity at desired values and the rated operation can then be performed again.

The following specific example can be mentioned.

Interior capacity: 30 liters.

Heat-insulating material:

Two-components, non-flon type expanded resin; thickness: 80 mm.

Peltier device:

142 semiconductor chips are used. Each chip is in a square form of 1.4 mm per side. Two-stage cascaded structure. 6 sets are mounted.

Heat-absorbing system:

A first thermal conductor made of aluminum is provided with an interior fan and heat-absorbing fins. Voltage for the interior fan: 6 to 12 V (rated voltage: 6 V).

Heat-dissipating system:

Recirculation type making use of purified water as a heat transfer medium. Final dissipation of heat is performed by dissipating heat into the open air through a radiator.

Preset interior temperature of the refrigerated storage compartment:

3.5° C.

External air temperature:

30° C.

In the above-described embodiment, the description was made about the electric refrigerator for general domestic use. This invention is however not limited to such an electric refrigerator but can also be applied, for example, to a storage box apparatus called a "home delivery storage box". There is a system, in which a storage box apparatus is arranged in a detached house or in a multiple dwelling house such as a condominium. If no one is at a consignee's house when a home delivery serviceman visits there, he leaves a package in the storage box apparatus and also drops a delivery slip in a mail box of the consignee's house. When the consignee returns home, the consignee learns the delivery of the package from the delivery slip and then receives the package from the storage box apparatus. As this storage box apparatus, for example, as a storage cabinet having refrigerating or freezing function for storing a perishable such as meat or fish, the electric refrigerator according to the present invention can be applied.

What is claimed is:

1. An electric refrigerator comprising:

a casing formed of a heat-insulating layer and defining an opening;

a heat-insulating door for openably closing said opening of said casing;

a thermal conductor arranged in said casing and provided with a heat-conducting surface located opposite an interior space in said casing;

a Peltier device thermally connected with said thermal conductor;

a device power supply for feeding electric power to said Peltier device; and a control unit for controlling said device power supply so that, after said heat-insulating door is closed subsequent to opening thereof, said device power supply supplies said Peltier device with electric power controlled in a range of from 1.3 to 2 times as much rated electric power required to maintain a preset interior temperature of said casing.

2. An electric refrigerator according to claim 1, wherein said Peltier device has a cascade structure.

\* \* \* \* \*